US012681049B2

(12) United States Patent
Huang et al.

(10) Patent No.: US 12,681,049 B2
(45) Date of Patent: Jul. 14, 2026

(54) CURRENT DETECTION CIRCUIT AND METHOD FOR IMPROVING ACCURACY OF INDUCTOR CURRENT DETECTION

(71) Applicant: ARK HDPS SEMICONDUCTOR PTE. LIMITED., Singapore (SG)

(72) Inventors: Shun-Yu Huang, Nantou County (TW); Wei-Jen Huang, Hsinchu County (TW); Sih-Ying Li, Taichung City (TW)

(73) Assignee: Ark HDPS Semiconductor Pte. LIMITED., Singapore (SG)

( * ) Notice: Subject to any disclaimer, the term of this patent is extended or adjusted under 35 U.S.C. 154(b) by 225 days.

(21) Appl. No.: 18/755,621

(22) Filed: Jun. 26, 2024

(65) Prior Publication Data

US 2025/0004017 A1     Jan. 2, 2025

(30) Foreign Application Priority Data

Jun. 27, 2023    (CN) .......................... 202310763135.2

(51) Int. Cl.
*G01R 15/16* (2006.01)
*G01R 19/00* (2006.01)
(52) U.S. Cl.
CPC ......... *G01R 15/16* (2013.01); *G01R 19/0092* (2013.01)
(58) Field of Classification Search
CPC .............................. G01R 15/16; H02H 7/1213
USPC ........................................................ 324/126
See application file for complete search history.

(56) References Cited

U.S. PATENT DOCUMENTS

| | | | | |
|---|---|---|---|---|
| 7,068,022 B2 * | 6/2006 | Balakrishnan | ...... | H02M 3/1563 |
| | | | | 363/21.09 |
| 7,348,765 B2 * | 3/2008 | Nishida | ................. | H02M 3/156 |
| | | | | 323/282 |
| 8,154,267 B2 * | 4/2012 | Noda | .................... | H02M 3/156 |
| | | | | 323/284 |
| 9,502,980 B2 * | 11/2016 | Rahimi | ................. | H02M 3/158 |
| 10,063,146 B1 * | 8/2018 | Lee | ........................ | G01R 19/003 |
| 11,223,276 B1 * | 1/2022 | Cai | ....................... | H02M 1/0022 |
| 2013/0314067 A1 * | 11/2013 | Matzberger | ......... | H02M 3/1588 |
| | | | | 323/311 |
| 2016/0134196 A1 * | 5/2016 | Knoedgen | ........... | H02M 1/4208 |
| | | | | 315/307 |
| 2017/0219639 A1 * | 8/2017 | Boudreau | ............ | G01R 15/146 |
| 2018/0024171 A1 * | 1/2018 | Dearborn | .......... | G01R 19/0046 |
| | | | | 324/76.11 |

(Continued)

FOREIGN PATENT DOCUMENTS

| | | |
|---|---|---|
| CN | 101682256 A | 3/2010 |
| JP | 2007-209103 | 8/2007 |

OTHER PUBLICATIONS

Translation of CN 208818756 (Year: 2019).*

*Primary Examiner* — Christopher P McAndrew
(74) *Attorney, Agent, or Firm* — Winston Hsu

(57) ABSTRACT

A current detection circuit includes a processing circuit used to operate during each switch cycle which includes a first period and a second period. A cycle detecting current is provided based on the terminal voltage established on a first end of a capacitor. The terminal voltage established on the first end of the capacitor is increased during the first period using a constant current. The terminal voltage established on the first end of the capacitor varies with a low-side detecting current during the second period.

16 Claims, 8 Drawing Sheets

(56) References Cited

U.S. PATENT DOCUMENTS

| | | | |
|---|---|---|---|
| 2018/0358898 A1* | 12/2018 | Yamaguchi | H02M 3/156 |
| 2019/0052176 A1 | 2/2019 | Yabuzaki | |
| 2019/0190387 A1* | 6/2019 | Dalena | H02M 1/08 |
| 2021/0364554 A1* | 11/2021 | Chen | G01R 19/16538 |
| 2022/0045600 A1* | 2/2022 | Shen | H02M 3/33576 |
| 2023/0223838 A1* | 7/2023 | Fernandez-Mattos | H02M 1/0009 |
| | | | 363/65 |
| 2023/0275505 A1* | 8/2023 | Li | H02M 1/0009 |
| | | | 323/284 |

* cited by examiner

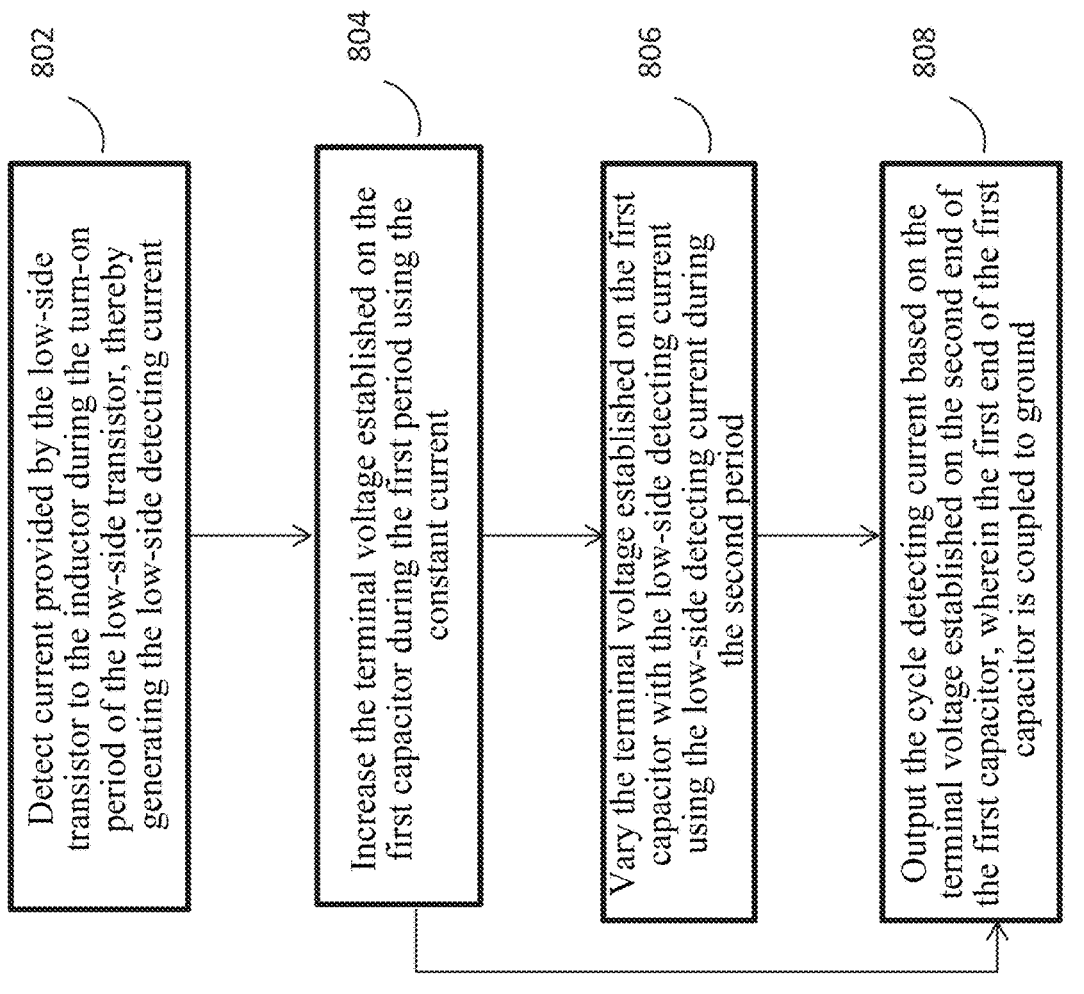

802

Detect current provided by the low-side transistor to the inductor during the turn-on period of the low-side transistor, thereby generating the low-side detecting current

804

Increase the terminal voltage established on the first capacitor during the first period using the constant current

806

Vary the terminal voltage established on the first capacitor with the low-side detecting current using the low-side detecting current during the second period

808

Output the cycle detecting current based on the terminal voltage established on the second end of the first capacitor, wherein the first end of the first capacitor is coupled to ground

FIG. 8

CURRENT DETECTION CIRCUIT AND METHOD FOR IMPROVING ACCURACY OF INDUCTOR CURRENT DETECTION

BACKGROUND OF THE INVENTION

1. Field of the Invention

The present invention is related to a current detection circuit and a related current detection method, a power conversion system and a power supply, and more particularly, to a current detection circuit of a DC-DC converter and a related current detection method, a power conversion system and a power supply.

2. Description of the Prior Art

A direct-current to direct-current (DC-DC) converter typically includes two power transistors coupled between an input end and a ground. A switch node between these two power transistors is coupled to an inductor, and these two power transistors are configured to operate in a complimentary manner.

In related techniques, it is often required to detect inductor current flowing through the inductor for over-current protection or current feedback purpose.

SUMMARY OF THE INVENTION

The present invention provides a current detection circuit for a DC-DC converter. The DC-DC converter includes a high-side transistor and a low-side transistor coupled in series between an input end and a ground with a switch node formed between the high-side transistor and the low-side transistor. The switch node is coupled to an inductor. The current detection circuit includes a first detection circuit and a processing circuit. The first detection circuit is configured to detect a current provided by the low-side transistor to the inductor during a turn-on period of the low-side transistor, thereby generating a low-side detecting current. The processing circuit includes a first capacitor having a first end coupled to the ground and configured to perform an operation during a first and a second switch cycle. The operation includes outputting a cycle detecting current based on a terminal voltage established at a second end of the first capacitor; increasing the terminal voltage established on the first capacitor by applying a constant current during a first period of the first switch cycle, wherein the first period is a turn-on period of the high-side transistor or a turn-off period of the low-side transistor; varying the terminal voltage with the low-side detecting current generated during a second period of the first switch cycle; and determining a magnitude of the constant current to be applied during the second switch cycle based on levels of the terminal voltages established at least at two time points during the first switch cycle. The at least two time points include at least one time point within the turn-on period of the low-side transistor, which occurs during the second period of the first switch cycle.

The present invention also provides a current detection method for a DC-DC converter. The DC-DC converter includes a high-side transistor and a low-side transistor coupled in series between an input end and a ground. A switch node between the high-side transistor and the low-side transistor is coupled to an inductor. During each switch cycle among a plurality of switch cycles of the DC-DC converter, the current detection method includes outputting a cycle detecting current based on a terminal voltage established on a second end of a first capacitor, wherein a first end of the first capacitor is coupled to the ground; detecting a current provided by the low-side transistor to the inductor during a turn-on period of the low-side transistor for acquiring a low-side detecting current; increasing the terminal voltage established on the first capacitor using a constant current during a first period, wherein the first period is a turn-on period of the high-side transistor or a turn-off period of the low-side transistor; and varying the terminal voltage established on the first capacitor with the low-side detecting current using the low-side detecting current during a second period. The second period and the first period form a switch cycle of the DC-DC converter. Each set of switch cycles includes a first switch cycle and a second switch cycle of the DC-DC converter. The first switch cycle and the second switch cycle are consecutive switch cycles. A magnitude of the constant current during the second switch cycle in each set of switch cycles is determined based on levels of the terminal voltage established on the first capacitor at least at two time points in the first switch cycle. The at least two time points includes at least one time point in the second period when the low-side transistor is turned on.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a flowchart illustrating a current detection method of a DC-DC converter according to an embodiment of the present invention.

DETAILED DESCRIPTION

Figure 1:
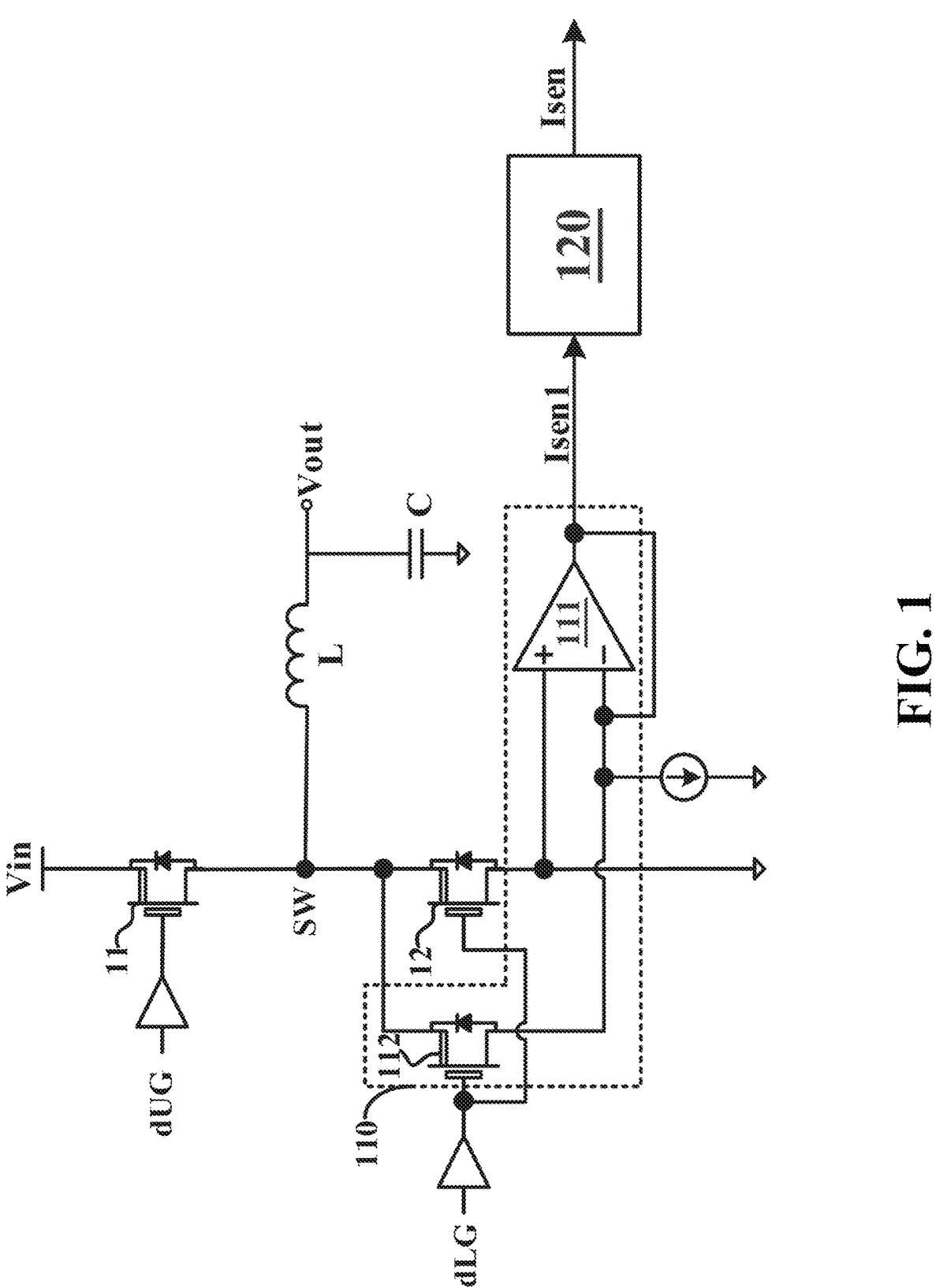
FIG. 1 is a diagram illustrating a power conversion system according to an embodiment of the present invention.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments. As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

In the prior art, a first detection circuit including a detection transistor and an amplifier is used to detect a first current flowing through a first power transistor, and a second detection circuit including a detection transistor and an amplifier is used to detect a second current flowing through a second power transistor. The inductor current of the DC-DC converter may be acquired by summing the first current and the second current. Or, when the first power transistor is turned on and the second power transistor is turned off, the first current flowing through the first power transistor may be used as the inductor current of the DC-DC converter.

However, during a switch cycle of the DC-DC converter, the turn-on period of a high-side transistor is shorter than the turn-on period of a low-side transistor. Also, during the turn-on period of each power transistor, the detection circuit may fail to operate accurately due to switch ringing. In other words, the operation of the detection circuit during the turn-on period of the high-side transistor is less accurate than during the turn-on period of the low-side transistor.

Therefore, the present invention provide the following embodiments in which the detection circuit is configured to only detect the current flowing through the low-side transistor without detecting the current flowing through the high-side transistor, thereby improving the accuracy of inductor current detection.

FIG. 1 is a diagram illustrating a power conversion system according to an embodiment of the present invention. As depicted in FIG. 1, the power conversion system includes a DC/DC converter and a current detection circuit for the DC-DC converter. The DC/DC converter is configured to receive an input voltage via an input end Vin, convert the input voltage into an output voltage, and output the output voltage via an output end Vout. The DC/DC converter includes a high-side transistor 11 and a low-side transistor 12 coupled in series between the input end Vin and a ground. The high-side transistor 11 and the low-side transistor 12 are configured to operate in a complimentary manner. More specifically, the high-side transistor 11 is configured to be turned off when the low-side transistor 12 is turned on, and the low-side transistor 12 is configured to be turned off when the high-side transistor 11 is turned on. As depicted in FIG. 1, a control signal dUG is used to control the high-side transistor 11 and a control signal dLG is used to control the low-side transistor 12, so that the high-side transistor 11 and the low-side transistor 12 may operate in a complimentary manner.

In some embodiments, each of the high-side transistor 11 and the low-side transistor 12 is a metal-oxide-semiconductor field-effect transistor (MOSFET), such as an N-type MOSFET or a P-type MOSFET. However, the types of the high-side transistor 11 and the low-side transistor 12 are not limited thereto.

A switch node SW between the high-side transistor 11 and the low-side transistor 12 is coupled to an inductor L. As depicted in the embodiment of FIG. 1, the DC-DC converter further includes a capacitor C having a first end coupled to the ground and a second end coupled to the inductor L. The current detection circuit of the DC-DC converter includes a first detection circuit 110 configured to detect the current provided by the low-side transistor 12 to the inductor L during the turn-on period of the low-side transistor 12, thereby generating a low-side detecting current Isen1.

In the embodiment depicted in FIG. 1, the first detection circuit 110 includes an operational amplifier 111 and a detection transistor 112. The detection transistor 112 may be of the same type as the low-side transistor 12, and the conduction resistance of the detection transistor 112 may be K times the conduction resistance of the low-side transistor 12. For example, K may be an integer larger than or equal to 2. In some embodiments, the detection transistor 112 and the low-side transistor 12 are fabricated on the same die and at adjacent locations. This way, the detection transistor 112 and the low-side transistor 12 may have similar semiconductor parameters except for a major difference in channel W/L ratio. Also, the detection transistor 112 and the low-side transistor 12 may encounter similar temperature variations during the operation of the DC-DC converter.

For example, the gate of the detection transistor 112 and the gate of the low-side transistor 12 receive the same control signal dLG. One end (such as the source) of the detection transistor 112 is coupled to one end (such as the source) of the low-side transistor 12. The positive input end of the operational amplifier 111 is coupled to another end (such as the drain) of the low-side transistor 12. The negative input end of the operational amplifier 111 is coupled to another end (such as the drain) of the detection transistor 112. The negative input end and the output end of the operational amplifier 111 are coupled together. The low-side detecting current Isen1 is outputted via the output end of the operational amplifier 111.

Figure 3:
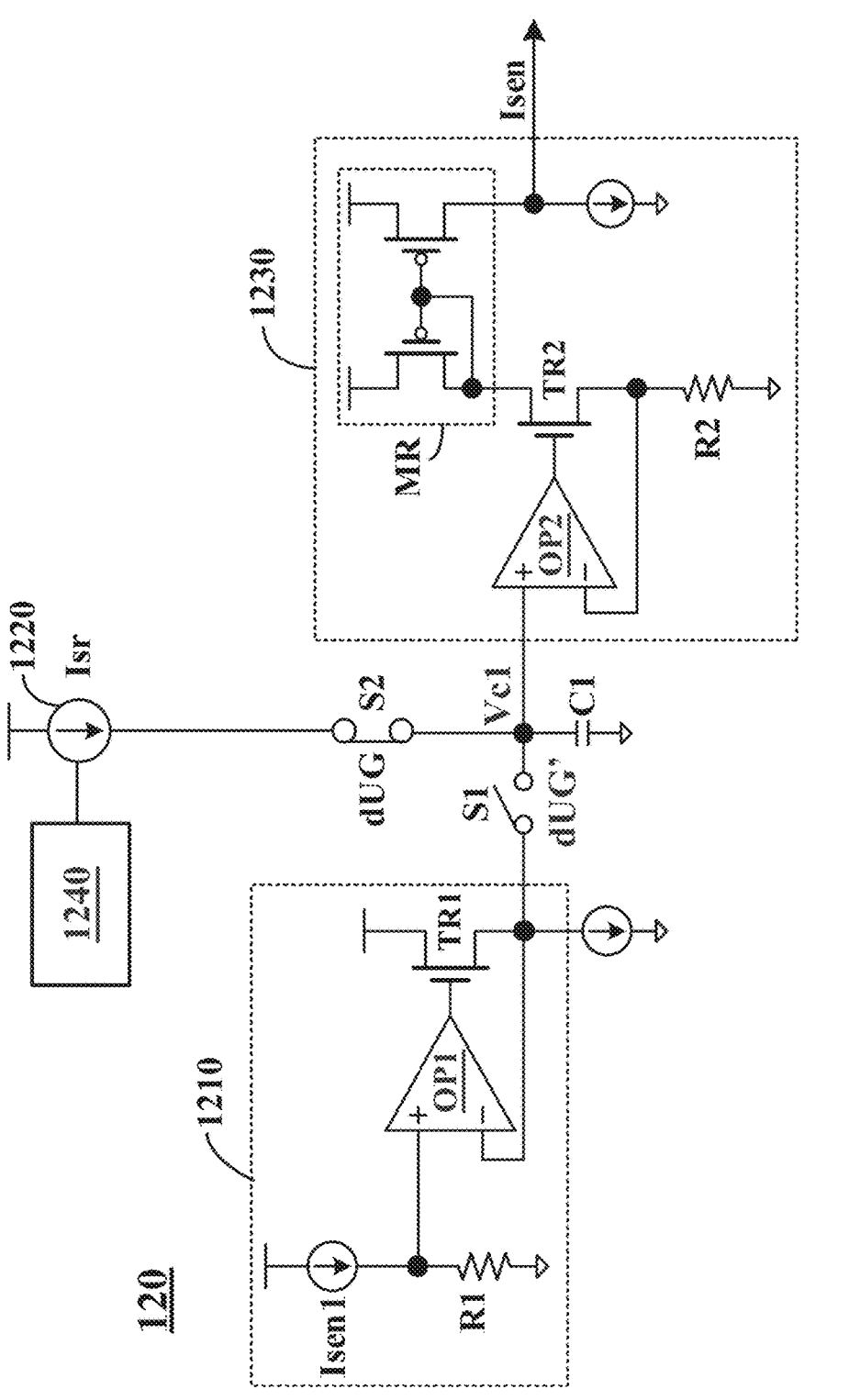
FIG. 3 is a diagram illustrating an implementation of the processing circuit according to an embodiment of the present invention.

The current detection circuit of the DC-DC converter further includes a processing circuit 120 as depicted in FIG. 1. As depicted in FIG. 3, the processing circuit 120 includes a first capacitor C1 having a grounded first end and an ungrounded second end. The processing circuit 120 is configured to perform an operation during each switch cycle among a plurality of switch cycles of the DC-DC converter. The above-mentioned operation of the processing circuit 120 includes outputting a cycle detecting current Isen based on a terminal voltage Vc1 established on the second end of the first capacitor C1.

Each switch cycle of the DC-DC converter can consist of a first period p1 and a second period p2. The first period p1 is either a turn-on period of the high-side transistor 11 or a turn-off period of the low-side transistor 12. For example, the first period p1 is a turn-on period of the high-side transistor 11 and the second period p2 is a turn-off period of the high-side transistor 11. In another example, the first period p1 is a turn-off period of the low-side transistor 12 and the second period p2 is a turn-on period of the low-side transistor 12.

In other words, the first period p1 always includes a turn-on period of the high-side transistor 11, and the second period p2 always includes a turn-on period of the low-side transistor 12. The operation performed by the processing circuit 120 during each switch cycle among a plurality of switch cycles of the DC-DC converter further includes increasing the terminal voltage Vc1 established on the first capacitor C1 during the first period p1 using a constant current Isr.

It is to be understood that the constant current Isr is configured to provide current of a constant magnitude during the first period p1 of a certain switch cycle. During the first period p1 of another switch cycle, the constant current Isr may have the same or a different magnitude. Under the circumstance when the terminal voltage Vc1 established on the first capacitor C1 is increased during the first period p1 using the constant current Isr, the terminal voltage Vc1 increases with a constant slope during the first period p1, and the cycle detecting current Isen outputted by the processing circuit 120 based on the terminal voltage Vc1 also increases with a constant slope during the first period p1. In other words, during the first period p1 when the high-side transistor 11 is turned on, the cycle detecting current Isen outputted by the processing circuit 120 also increases with a constant slope. Since the actual inductor current also increases with a constant slope during the turn-on period of the high-side transistor 11, the cycle detecting current Isen and the actual inductor current should have matching characteristics.

In other words, by increasing the terminal voltage Vc1 established on the first capacitor C1 during the first period p1 using the constant current Isr and outputting the cycle detecting current Isen based on the terminal voltage Vc1, the processing circuit 120 is able to output the cycle detecting current Isen which increases with a constant slope as the actual inductor current during the turn-on period of the high-side transistor 11. That is, during the turn-on period of the high-side transistor 11, instead of outputting the current detected by the detection circuit, the processing circuit 120 is configured to output pseudo current based on the terminal voltage Vc1 which increases with a constant slope.

In some embodiments, the first period p1 is the turn-on period of the high-side transistor 11. The processing circuit 120 is configured to increase the terminal voltage Vc1 established on the first capacitor C1 using the constant current Isr only during the turn-on period of the high-side transistor 11, thereby outputting the cycle detecting current Isen which increases with a constant slope during the turn-on period of the high-side transistor 11. This way, the characteristic of the cycle detecting current Isen better matches the actual inductor current which increases with a constant slope only during the turn-on period of the high-side transistor 11, thereby improving the accuracy of inductor current detection.

The operation performed by the processing circuit 120 during each switch cycle among the at least one set of switch cycles of the DC-Dc converter further includes varying the terminal voltage V1 established on the first capacitor C1 with the low-side detecting current Isen1 using the low-side detecting current Isen1 outputted by the first detection circuit 110 during the second period p2. Under such a circumstance, ignoring circuit transmission loss, the cycle detecting current Isen outputted by the processing circuit 120 during the second period p2 when the low-side transistor 12 is turned on is equal to the low-side detecting current Isen1 outputted by the first detection circuit 110 during the second period p2 when the low-side transistor 12 is turned on. In other words, during the turn-on period of the low-side transistor 12, the processing circuit 120 is configured to output the low-side detecting current Isen1 detected by the first detection circuit 110.

In an embodiment of the present invention, each switch cycle within the at least one set of switch cycles includes two consecutive periods: a first period and a second period for the DC-DC converter. During each set of switch cycles, the magnitude of the constant current Isr during the second switch cycle is determined based on the terminal voltage Vc1 established on the first capacitor C1 at least at two time points during the first switch cycle. The at least two time points include at least one time point in the second period p2 when the low-side transistor 12 is turned on. In other words, at least two time points in the previous switch cycle are selected wherein at least one of the selected time point is in the second period p2 when the low-side transistor 12 is turned on, and the terminal voltages Vc1 established on the first capacitor C1 at the at least two time points are measured for determining the magnitude of the constant current Isr in the subsequent switch cycle.

It is to be understood that the magnitude of the constant current Isr during the second switch cycle determines the slope of the terminal voltage Vc1 established on the first capacitor C1 during the first period p1 of the second switch cycle (i.e., the slope of the cycle detecting current Isen during the first period p1 of the second switch cycle). Also, the level of the terminal voltage Vc1 established on the first capacitor C1 at each time point during the first switch cycle determines the magnitude of the cycle detecting current Isen outputted by the processing circuit 120 at each corresponding time point.

The magnitude of the constant current Isr during the second switch cycle is determined based on the levels of the terminal voltage Vc1 established on the first capacitor C1 at least at two time points during the first switch cycle. In other words, the slope of the cycle detecting current Isen during the first period p1 of the second switch cycle is determined by the magnitudes of the cycle detecting current Isen outputted by the processing circuit 120 at least at two time points in the first switch cycle.

Since the actual inductor current is continuous, based on the magnitudes of the cycle detecting current Isen at least at two time points during the previous switch cycle, the slope of the cycle detecting current Isen outputted during the subsequent switch cycle based on the pseudo current may be close to the slope of the actual inductor current during the second switch cycle, thereby improving the accuracy of inductor current detection.

Furthermore, the at least two time points include at least one time point in the second period p2 when the low-side transistor 12 is turned on. In other words, the slope of the cycle detecting current Isen during the first period p1 of the second switch cycle is determined based on the magnitude of the cycle detecting current Isen at least at one time point during the second period p2 of the first switch cycle when the low-side transistor 12 is turned on.

Since the magnitude of the cycle detecting current Isen during the first switch cycle when the low-side transistor 12 is turned on is a precise value which is actually detected by the first detection circuit 110, based on the magnitude of the cycle detecting current Isen at least at one time point during the first switch cycle when the low-side transistor 12 is turned on, the slope of the cycle detecting current Isen during the second switch cycle may be closer to the slope of the actual inductor current during the second switch cycle, thereby further improving the accuracy of inductor current detection.

In the above-mentioned embodiments, the processing circuit 120 is configured to increase the terminal voltage Vc1 established on the first capacitor C1 using the constant current Isr during the first period p1 in the switch cycle of the DC-DC converter, and vary the terminal voltage Vc1 established on the first capacitor C1 with the low-side detecting current Isen1 using the low-side detecting current Isen1 during the second period p2 in the switch cycle of the DC-DC converter, thereby outputting the cycle detecting current Isen based on the terminal voltage Vc1 established on the first capacitor C1 during the switch cycle of the DC-DC converter. This way, the processing circuit 120 may output the cycle detecting current Isen which increases with a constant slope as the actual inductor current during the turn-on period of the high-side transistor 11, and output the accurate low-side detecting current Isen1 provided by the first detection circuit 110 during the turn-on period of the low-side transistor 12. Also, the magnitude of the constant current Isr during the subsequent switch cycle is determined based on the levels of the terminal voltage Vc1 established on the first capacitor C1 at least at two time points during the previous switch cycle, wherein the least two time points include at least one time point during the second period p2 when the low-side transistor 12 is turned on. This way, the slope of the cycle detecting current Isen during the second switch cycle may be close to the slope of the actual inductor current during the second switch cycle, thereby improving the accuracy of inductor current detection.

In some embodiments, the processing circuit 120 is configured to perform the above-mentioned operation during each switch cycle among multiple sets of switch cycles, thereby further improving the accuracy of inductor current detection. In some other embodiments, the processing circuit 120 is configured to perform the above-mentioned operation during two consecutive switch cycles: the first switch cycle and second switch cycle, thereby further improving the accuracy of inductor current detection.

A first implementation method and a second implementation method of determining the magnitude of the constant current Isr during the second switch cycle based on the levels of the terminal voltage Vc1 established on the first capacitor C1 at least at two time points during the first switch cycle are illustrated.

In the first implementation method, the at least two time points are time points in the second period p2 when the low-side transistor 12 is turned on. In other words, the magnitude of the constant current Isr during the second switch cycle is determined based on the levels of the terminal voltage Vc1 established on the first capacitor C1 at least at two time points during the second period p2 of the first switch cycle when the low-side transistor 12 is turned on in the first implementation method.

For example, based on the levels of the terminal voltage Vc1 established on the first capacitor C1 at least at two time points during the second period p2 of the first switch cycle when the low-side transistor 12 is turned on, the negative slope of the terminal voltage Vc1 during the first switch cycle when the low-side transistor 12 is turned on (i.e., the negative slope of the cycle detecting current Isen during the first switch cycle when the low-side transistor 12 is turned on) may be calculated. Next, based on the negative slope of the terminal voltage Vc1 during the first switch cycle when the low-side transistor 12 is turned on, the expected positive slope of the terminal voltage Vc1 during the first period p1 of the second switch cycle (i.e., the expected positive slope of the cycle detecting current Isen during the first period p1 of the second switch cycle) may be calculated. Therefore, the magnitude of the constant current Isr during the second switch cycle may be determined based on the expected positive slope of the terminal voltage Vc1 during the first period p1 in the second switch cycle. This way, the slope of the cycle detecting current Isen during the second switch cycle may be close to the slope of the actual inductor current during the second switch cycle, thereby improving the accuracy of inductor current detection.

Figure 2:
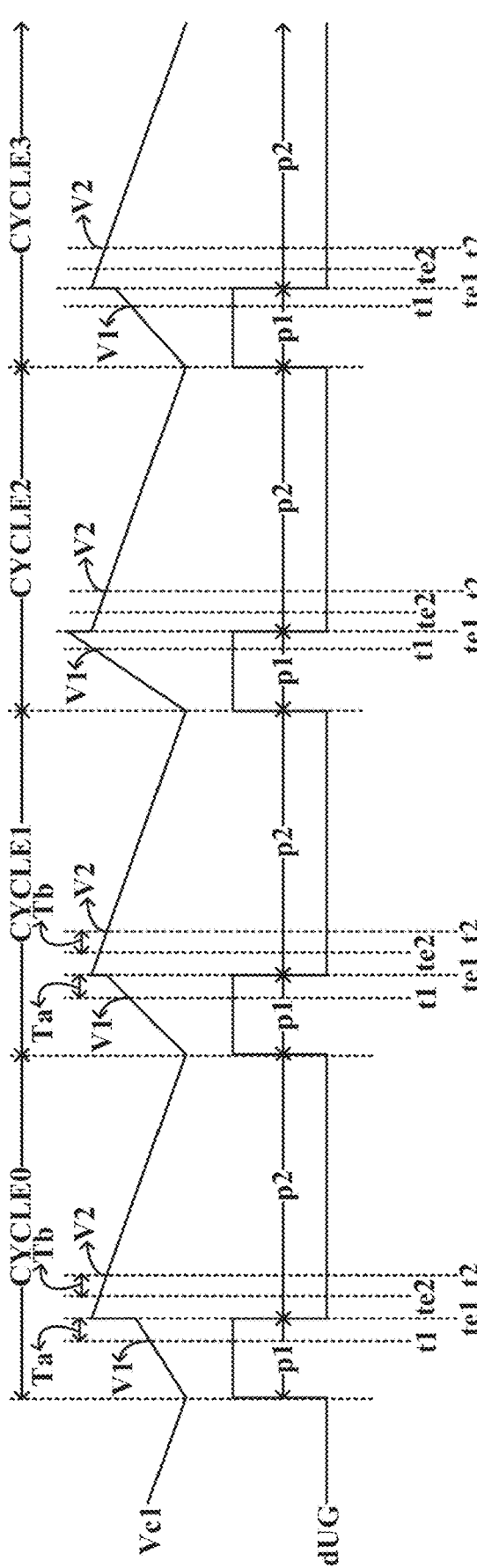
FIG. 2 is a diagram illustrating a signal waveform diagram during the operation of the DC-DC converter according to an embodiment of the present invention.

The second implementation method of determining the magnitude of the constant current Isr during the second switch cycle based on the levels of the terminal voltage Vc1 established on the first capacitor C1 at least at two time points during the first switch cycle are illustrated in FIG. 2.

FIG. 2 is a diagram illustrating a signal waveform diagram during the operation of the DC-DC converter according to an embodiment of the present invention. FIG. 2 depicts the signal waveforms of the terminal voltage Vc1 established on the first capacitor C1 and the control signal dUG of the high-side transistor 11. It is to be understood that the waveform of the cycle detecting current Isen outputted by the processing circuit 120 and the waveform of the terminal voltage Vc1 are basically identical. Although not depicted in FIG. 2, it is to be understood the control signal dLG of the low-side transistor 12 is at a high level during the second period p2 of each switch cycle so that the low-side transistor 12 may be turned on during the second period p2.

FIG. 2 schematically depicts that the first period p1 is the turn-on period of the high-side transistor 11 and the second period p2 is the turn-off period of the high-side transistor 11. Schematically, the high-side transistor 11 is turned on when the control signal dUG is at a high level, and the high-side transistor 11 is turned off when the control signal dUG is at a low level.

In the second implementation method, the at least two time points further include a first time point t1 during the first period when the high-side transistor 11 is turned on, and the at least one time point during the second period p2 when the low-side transistor 12 is turned on includes a second time point t2. In other words, the magnitude of the constant current Isr during the second switch cycle is determined based on at least the levels of the terminal voltage Vc1 established on the first capacitor C1 at two time points during the first switch cycle, wherein the above-mentioned two time points are the first time point t1 during the first period p1 when the high-side transistor 11 is turned on and the second time point t2 during the second period p2 when the low-side transistor 12 is turned on.

Under such a circumstance, the processing circuit 120 is further configured to adjust the magnitude of the constant current Isr during the second switch cycle based on a first value V1 of the terminal voltage Vc1 established on the first capacitor C1 at the first time point t1 and a second value V2 of the terminal voltage Vc1 established on the first capacitor C1 at the second time point t2. This way, the processing circuit 120 may automatically adjust the magnitude of the constant current Isr during the second switch cycle based on the comparison result between the first value V1 and the second value V2, so that the positive slope of the cycle detecting current Isen during the second switch cycle may be close to the positive slope of the actual inductor current during the second switch cycle, thereby improving the accuracy of inductor current detection.

In some embodiments, in the situation when the first value V1 is larger than the second value V2, the processing circuit 120 is configured to adjust the magnitude of the constant current Isr during the second switch cycle to be smaller than the magnitude of the constant current Isr during the first switch cycle. Also, in the situation when the first value V1 is smaller than the second value V2, the processing circuit 120 is configured to adjust the magnitude of the constant current Isr during the second switch cycle to be larger than the magnitude of the constant current Isr during the first switch cycle.

For illustrative purpose, the following explanation incorporates FIG. 2. FIG. 2 schematically depicts four consecutive switch cycles. From left to right, these four switch cycles sequentially include a switch cycle CYCLE0, a switch cycle CYCLE1, a switch cycle CYCLE2, and a switch cycle CYCLE3.

During the switch cycle CYCLE0, the first value V1 is smaller than the second value V2, which indicates that the positive slope of the terminal voltage Vc1 (or alternatively, the positive slope of the cycle detecting current Isen) during the first period p1 of the switch cycle CYCLE0 may be smaller than the positive slope of the actual inductor current. Therefore, the magnitude of the constant current Isr is increased during the switch cycle CYCLE1 (i.e., the second switch cycle) subsequent to the switch cycle CYCLE0 (i.e., the first switch cycle) for increasing the positive slope of the cycle detecting current Isen during the switch cycle CYCLE1. This way, the positive slope of the cycle detecting current Isen during the switch cycle CYCLE1 may be closer to the positive slope of the actual inductor current.

During the switch cycle CYCLE1, the first value V1 is still smaller than the second value V2, which indicates that the positive slope of the terminal voltage Vc1 (or alternatively, the positive slope of the cycle detecting current Isen) during the first period p1 in the switch cycle CYCLE1 may still be smaller than the positive slope of the actual inductor current. Therefore, the magnitude of the constant current Isr is further increased during the switch cycle CYCLE2 (i.e., the second switch cycle) subsequent to the switch cycle CYCLE1 (i.e., the first switch cycle) for further increasing the positive slope of the cycle detecting current Isen during the switch cycle CYCLE2. This way, the positive slope of the cycle detecting current Isen during the switch cycle CYCLE2 may be closer to the positive slope of the actual inductor current.

During the switch cycle CYCLE2, the first value V1 is larger than the second value V2, which indicates that the positive slope of the terminal voltage Vc1 (or alternatively, the positive slope of the cycle detecting current Isen) during the first period p1 in the switch cycle CYCLE2 may be larger than the positive slope of the actual inductor current. Therefore, the magnitude of the constant current Isr is reduced during the switch cycle CYCLE3 (i.e., the second switch cycle) subsequent to the switch cycle CYCLE2 (i.e., the first switch cycle) for decreasing the positive slope of the cycle detecting current Isen during the switch cycle CYCLE3. This way, the positive slope of the cycle detecting current Isen during the switch cycle CYCLE3 may be closer to the positive slope of the actual inductor current, thereby further improving the accuracy of inductor current detection.

In the embodiment depicted in FIG. 2, the time length Ta between the first time point t1 and the end time te1 of the first period p1 in the first switch cycle is smaller than or equal to a first predetermined time length. By configuring the time length Ta between the first time point t1 and the end time te1 of the first period p1 in the first switch cycle to be smaller than or equal to the first predetermined time length, the first time point t1 may be closer to the end time of the first period p1. In other words, under such a circumstance, the first value V1 of the terminal voltage Vc1 at the first time point t1 may be closer to the extremum of the terminal voltage Vc1 when the high-side transistor 11 is turned on. This way, by adjusting the constant current Isr based on the first value V1, the positive slope of the cycle detecting current Isen during the second switch cycle may be closer to the positive slope of the actual inductor current, thereby further improving the accuracy of inductor current detection.

In some embodiments, the first predetermined time length may be equal to 1/R of the time length of the first period p1 in the first switch cycle, wherein R may be any value between 10 and 100. For example, R may be equal to 10, which means the first predetermined time length is equal to 1/10 of the time length of the first period p1 in the first switch cycle. In some embodiments, the first predetermined time length may have any value between 5 ns and 30 ns, such as 5 ns, 10 ns or 15 ns. Based on the above-mentioned embodiments, the first time point t1 may be closer to the end time of the first period p1, thereby further improving the accuracy of inductor current detection.

In the embodiment depicted in FIG. 1, the first detection circuit 110 includes an operational amplifier 111. Under such a circumstance, the second time point t2 is after the end time te2 of the setting time of the operational amplifier 111 in the first switch cycle, and the time length Tb between the end time te2 of the setting time and the second time point t2 is smaller than or equal to a second predetermined time length, as depicted in FIG. 2.

It is to be understood that the setting time is the time required by the operational amplifier 111 to provide stable output voltages within a designated error margin after receiving stable input voltages. In other words, the low-side detecting current Isen1 outputted by the first detection circuit 110 after the end time te2 of the setting time of the operational amplifier 111 is more accurate.

By configuring the time length Tb between the end time te2 of the setting time and the second time point t2 to be smaller than or equal to the second predetermined time length, the second time point t2 may be closer to the end time te2 of the setting time of the operational amplifier 111. That is, the second time point t2 may be closer to the time point when the first detection circuit 110 starts to output accurate low-side detecting current Isen1. In other words, under such a circumstance, the second value V2 of the terminal voltage Vc1 at the second time point t2 may be closer to the extremum of the terminal voltage Vc1 when varying with the more accurate low-side detecting current Isen1. This way, by adjusting the constant current Isr based on the second value V2, the positive slope of the cycle detecting current Isen during the second switch cycle may be closer to the positive slope of the actual inductor current, thereby further improving the accuracy of inductor current detection.

In some embodiments, the second predetermined time length may be equal to 1/S of the time length of the second period p2 in the first switch cycle, wherein S may be any value between 10 and 100. For example, S may be equal to 10. In some embodiments, the second predetermined time length may have any value between 5 ns and 30 ns, such as 5 ns, 10 ns or 15 ns. Based on the above-mentioned embodiments, the second time point t2 may be closer to the time point when the first detection circuit 110 starts to output accurate low-side detecting current Isen1, thereby further improving the accuracy of inductor current detection.

In another embodiments, the time length Ta between the first time point t1 and the end time te1 of the first period p1 in the first switch cycle is smaller than or equal to the first predetermined time length, the second time point t2 is after the end time te2 of the setting time of the operational amplifier 111 during the first switch cycle, and the time length Tb between the end time te2 of the setting time and the second time point t2 is smaller than or equal to the second predetermined time length. Under such a circumstance, the first value V1 of the terminal voltage Vc1 at the first time point t1 may be closer to the extremum of the terminal voltage Vc1 when the high-side transistor 11 is turned on, and the second value V2 of the terminal voltage Vc1 at the second time point t2 may be closer to the extremum of the terminal voltage Vc1 when varying with the more accurate low-side detecting current Isen1.

Since the extremum of the actual inductor current when the high-side transistor 11 is turned on is essentially the same as the extremum of the actual inductor current when the low-side transistor 12 is turned on, the first value V1 of the terminal voltage Vc1 at the first time point t1 is expected to be essentially the same as the second value V2 of the terminal voltage Vc1 at the second time point t2. In these embodiments, based on the comparison result between the terminal voltages Vc1 at the first time point t1 and at the second time point t2 (not any random two time points) which are expected to be identical, the magnitude of the constant current Isr during the second switch cycle may be adjusted so that the positive slope of the cycle detecting current Isen during the second switch cycle may be closer to the positive slope of the actual inductor current, thereby further improving the accuracy of inductor current detection.

Some embodiments of the processing circuit 120 in the second implementation method are illustrated in FIG. 3. FIG. 3 is a diagram illustrating an implementation of the processing circuit 120 according to an embodiment of the present invention. As depicted in FIG. 3, the processing circuit 120 includes a current-to-voltage converting circuit 1210 and a first switch S1. The current-to-voltage converting circuit 1210 is configured to convert the low-side detecting current Isen1 outputted by the first detection circuit 110 into a voltage. The switch S1 is coupled between the ungrounded second end of the first capacitor C1 and the current-to-voltage converting circuit 1210. The switch S1 is configured to be turned off during the first period p1 and turned on during the second period p2.

In the embodiment depicted in FIG. 3, the first period p1 is the turn-on period of the high-side transistor 11, the second period p2 is the turn-off period of the high-side transistor 11, and the control signal dUG' of the first switch S1 and the control signal dUG of the high-side transistor 11 have opposite logic-levels. Based on the current-to-voltage converting circuit 1210 and the first switch S1, the processing circuit 120 is configured to vary the terminal voltage Vc1 established on the first capacitor C1 with the low-side detecting current Isen1 using the low-side detecting current Isen1 during the second period p2.

As depicted in FIG. 3, the processing circuit 120 further includes a current source circuit 1220 and a second switch S2. The current source circuit 1220 is configured to provide the constant current Isr. The current source circuit 1220 may include an adjustable current source capable of providing a current of constant magnitude during the first period p1 of the same switch cycle. The adjustable current source may provide currents of different magnitudes during the first periods p1 of different switch cycles. The switch S2 is coupled between the current source circuit 1220 and the ungrounded second end of the first capacitor C1. The switch S2 is configured to be turned on during the first period p1 and turned off during the second period p2.

As depicted in FIG. 3, the first period p1 is the turn-on period of the high-side transistor 11, the second period p2 is the turn-off period of the high-side transistor 11, and the control signal of the second switch S2 may be the control signal dUG of the high-side transistor 11. Based on the current source circuit 1220 and the second switch S2, the processing circuit 120 is configured to increase the terminal voltage Vc1 established on the first capacitor C1 using the constant current Isr during the first period p1.

As depicted in FIG. 3, the processing circuit 120 further includes a voltage-to-current converting circuit 1230 coupled to the ungrounded second end of the first capacitor C1. The voltage-to-current converting circuit 1230 is configured to convert the terminal voltage Vc1 established on the first capacitor C1 into the cycle detecting current Isen. In the above-mentioned embodiments, the processing circuit 120 is able to increase the terminal voltage Vc1 established on the first capacitor C1 using the constant current Isr during the first period p1 as well as vary the terminal voltage Vc1 established on the first capacitor C1 with the low-side detecting current Isen1 using the low-side detecting current Isen1 during the second period p2, thereby outputting the cycle detecting current Isen based on the terminal voltage Vc1 established on the first capacitor C1.

In the embodiment depicted in FIG. 3, the current-to-voltage converting circuit 1210 may include a resistor R1, an operational amplifier OP1 and a transistor TR1. The first end of the resistor R1 is coupled to the first detection circuit 110 for receiving the low-side detecting current Isen1, and the second end of the resistor R1 is coupled to the ground. The positive input end of the operational amplifier OP1 is coupled to the first end of the resistor R1, the negative input end of the operational amplifier OP1 is coupled to the first end of the transistor TR1, and the output end of the operational amplifier OP1 is coupled to the second end of the transistor TR1. The third end of the transistor TR1 is coupled to a power end. Under such a circumstance, the operational amplifier OP1 and the transistor TR1 in the current-to-voltage converting circuit 1210 may function as a voltage buffering circuit between the resistor R1 and the first capacitor C1. This way, the reliability of the first capacitor C1 when converting the low-side detecting current Isen1 into voltage may be increased, thereby improving the reliability of the current detection circuit.

In the embodiment depicted in FIG. 3, the voltage-to-current converting circuit 1230 may include an operational amplifier OP2, a transistor TR2, a resistor R2, and a current mirror MR. The positive input end of the operational amplifier OP2 is coupled to the ungrounded second end of the first capacitor C1, the negative input end of the operational amplifier OP2 is coupled to the first end of the transistor TR2, and the output end of the operational amplifier OP2 is coupled to the second end of the transistor TR2. The first end of the transistor TR2 is coupled to the ground via the resistor R2, and the third end of the transistor TR2 is coupled to the current mirror MR. in an embodiment, the resistors R1 and R2 have the same resistance. This way, the cycle detecting current Isen outputted by the processing circuit 120 during the turn-on period of the low-side transistor 12 may be the same as the low-side detecting current Isen1 outputted by the first detection circuit 110 during the turn-on period of the low-side transistor 12. The structure of the current mirror MR is well-known to those skilled in the art, and is thus not further elaborated.

In the embodiment depicted in FIG. 3, the processing circuit 120 further includes an adjusting circuit 1240 coupled to the current source circuit 1220. The adjusting circuit 1240 is configured to adjust the magnitude of the constant current Isr during the second switch cycle based on the comparison result between the first value V1 of the terminal voltage Vc1 at the first time point t1 and the second value V2 of the terminal voltage Vc1 at the second time point t2. In other words, in these embodiments, the processing circuit 120 is further configured to adjust the magnitude of the constant current Isr during the second switch cycle using the above-mentioned second implementation method. Details of adjusting the magnitude of the constant current Isr during the second switch cycle are not reiterated herein.

Figure 4:
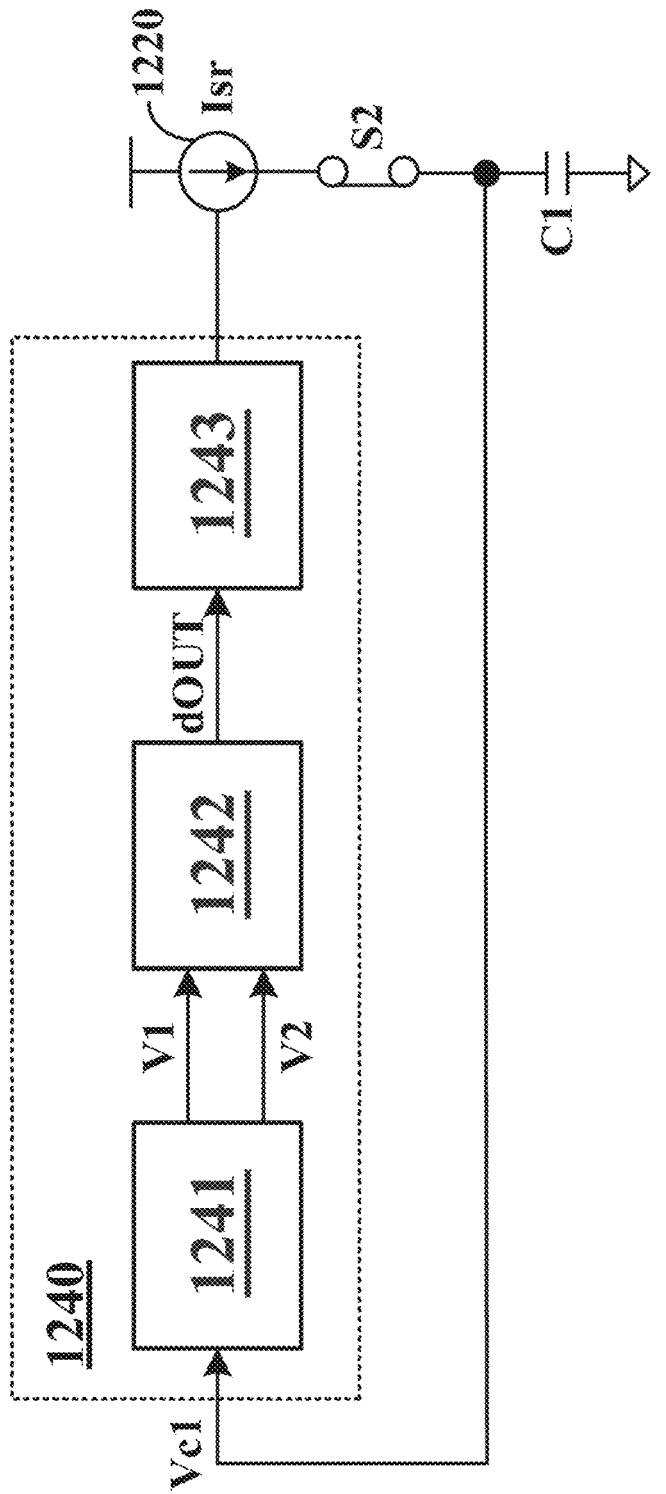
FIG. 4 is a diagram illustrating an implementation of the adjusting circuit according to an embodiment of the present invention.

Some embodiments of the adjusting circuit 1240 are illustrated in FIG. 4. FIG. 4 is a diagram illustrating an implementation of the adjusting circuit 1240 according to an embodiment of the present invention. As depicted in FIG. 4, the adjusting circuit 1240 includes a sample and hold circuit 1241, a comparison circuit 1242 and a current adjusting circuit 1243. The sample and hold circuit 1241 is configured to sample the terminal voltage Vc1 established on the first capacitor C1, thereby acquiring the first value V1 of the terminal voltage Vc1 at the first time point t1 and the second value V2 of the terminal voltage Vc1 at the second time point t2. The comparison circuit 1242 is configured to compare the first value V1 and the second value V2 provided by the sample and hold circuit 1241, thereby outputting an adjusting signal dOUT. For example, the adjusting signal dOUT is at a first level when the first value V1 is larger than the second value V2, and the adjusting signal dOUT is at a second level different from the first level when the first value V1 is smaller than the second value V2.

The current adjusting circuit 1243 is configured to adjust the magnitude of the constant current Isr provided by the current source circuit 1220 during the second switch cycle based on the adjusting signal dOUT. For example, when the adjusting signal dOUT is at the first level (i.e., the first value V1 is larger than the second value V2), the current adjusting circuit 1243 is configured to control the current source circuit 1220 to adjust the constant current Isr so that the magnitude of the constant current Isr during the second switch cycle is smaller than the magnitude of the constant current Isr during the first switch cycle. Similarly, when the adjusting signal dOUT is at the second level (i.e., the first value V1 is smaller than the second value V2), the current adjusting circuit 1243 is configured to control the current source circuit 1220 to adjust the constant current Isr so that the magnitude of the constant current Isr during the second switch cycle is larger than the magnitude of the constant current Isr during the first switch cycle. In the above-mentioned embodiments, using the adjusting circuit 1240 with a simple structure, the magnitude of the constant current Isr during the second switch cycle may be adjusted based on the comparison result between the first value V1 and the second value V2.

Figure 5:
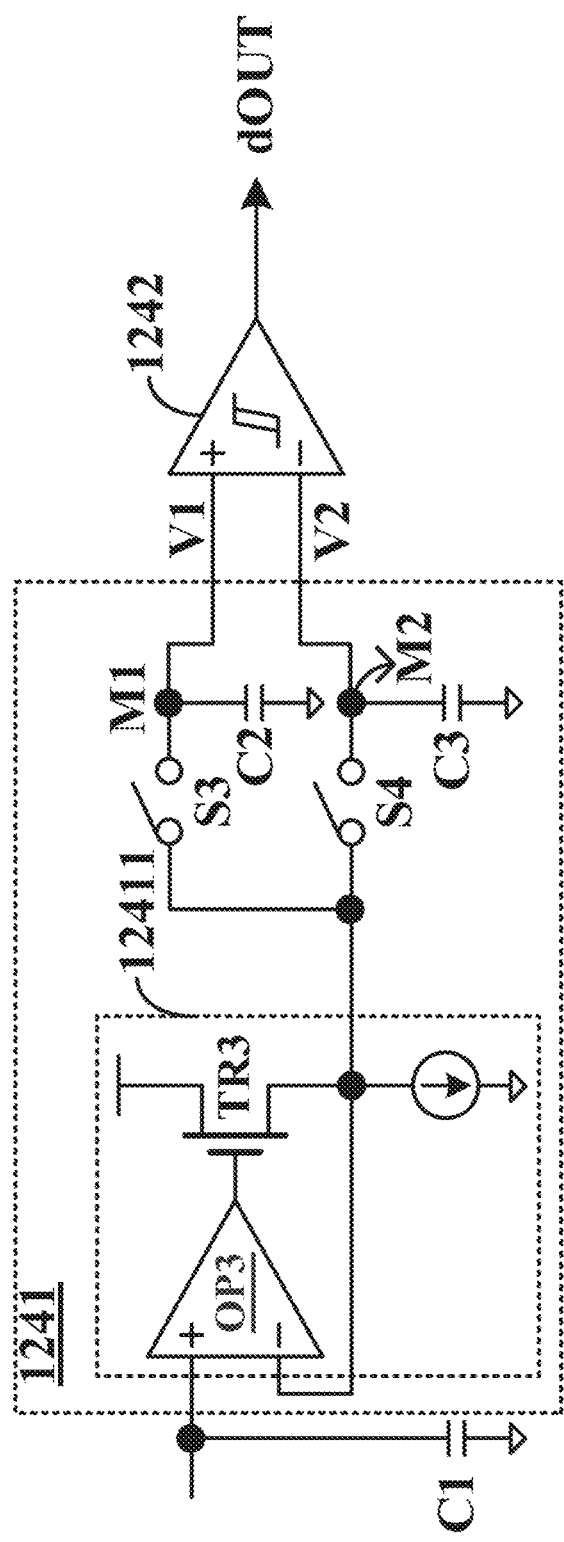
FIG. 5 is a diagram illustrating an implementation of the sample and hold circuit according to an embodiment of the present invention.
Figure 6:
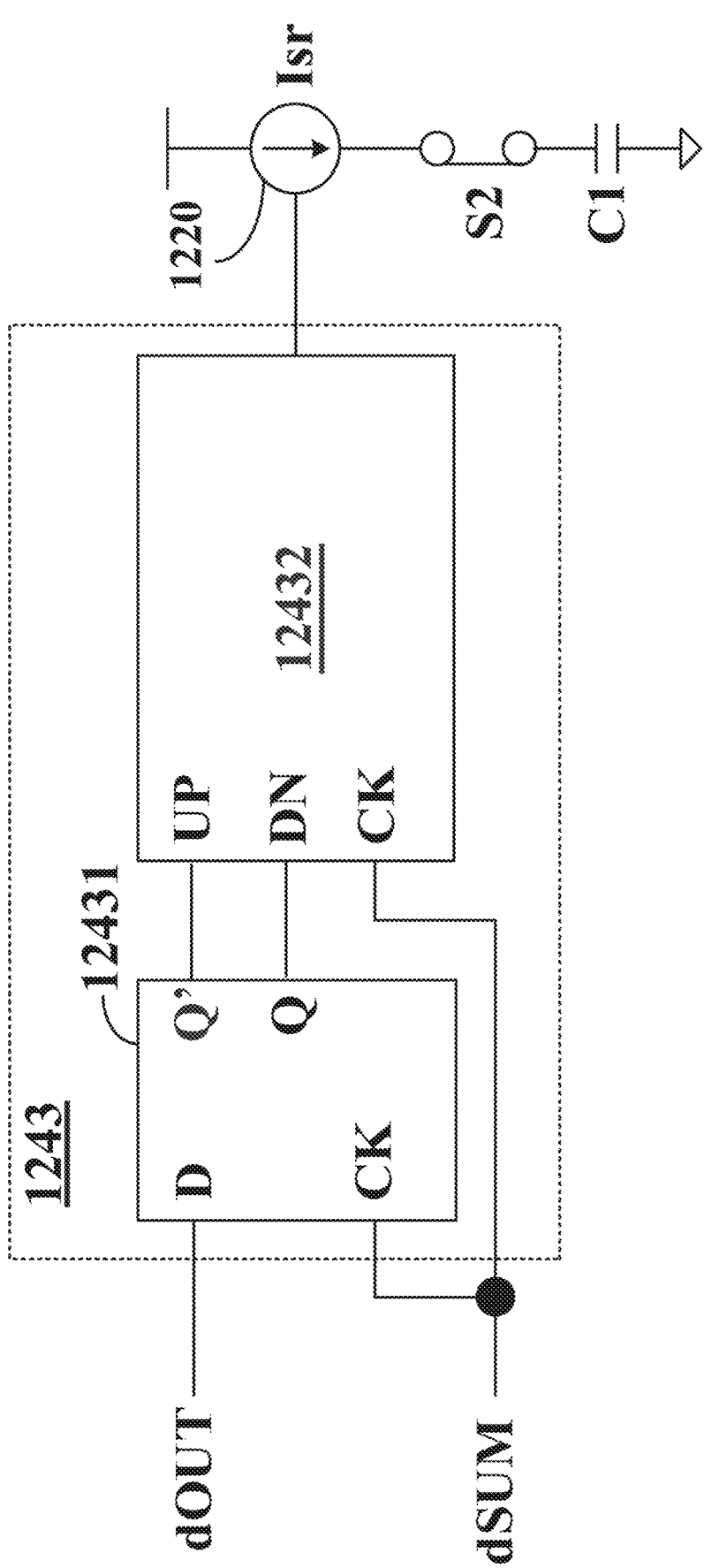
FIG. 6 is a diagram illustrating an implementation of the current adjusting circuit according to an embodiment of the present invention.

Some embodiments of the sample and hold circuit 1241 and the current adjusting circuit 1243 are illustrated in FIGS. 5 and 6. FIG. 5 is a diagram illustrating an implementation of the sample and hold circuit 1241 according to an embodiment of the present invention. As depicted in FIG. 5, the sample and hold circuit 1241 includes a voltage buffering circuit 12411 coupled to the second end of the first capacitor C1.

In an embodiment, the voltage buffering circuit 12411 may include an operational amplifier OP3 and a transistor TR3 as depicted in FIG. 5. The positive input end of the operational amplifier OP3 is coupled to the ungrounded second end of the first capacitor C1, the negative input end of the operational amplifier OP3 is coupled to the first end of the transistor TR3, and the output end of the operational amplifier OP3 is coupled to the second end of the transistor TR3. The third end of the transistor TR3 is coupled to a power end.

In the embodiment depicted in FIG. 5, the sample and hold circuit 1241 further includes a third switch S3, a second capacitor C2, a fourth switch S4 and a third capacitor C3. The third switch S3 is coupled between the voltage buffering circuit 12411 and the first input end of the comparison circuit 1242. The first end of the second capacitor C2 is coupled to a first node M1 between the third switch S3 and the first input end of the comparison circuit 1242, and the second end of the second capacitor C2 is coupled to the ground. The fourth switch S4 is coupled between the voltage buffering circuit 12411 and the second input end of the comparison circuit 1242. The first end of the third capacitor C3 is coupled to a second node M2 between the fourth switch S4 and the second input end of the comparison circuit 1242, and the second end of the third capacitor C3 is coupled to the ground. In the above-mentioned embodiments, the sample and hold circuit 1241 may retain the first value V1 using the second capacitor C2 and retain the second value V2 using the third capacitor C3, thereby providing the first value V1 to the first input end of the comparison circuit 1242 and providing the second value V2 to the second input end of the comparison circuit 1242.

In some embodiments, the third switch S3 is configured to switch from a turn-on state to a turn-off state at the first time point t1 and switch from the turn-off state to the turn-on state at the third time point t3, so that the second capacitor C2 may retain the voltage of the first value V1 between the first time point t1 and the third time point t3. The fourth switch S4 is configured to switch from the turn-on state to the turn-off state at the second time point t2 and switch from the turn-off state to the turn-on state at the fourth time point t4, so that the third capacitor C3 may retain the voltage of the second value V2 between the second time point t2 and the third time point t3. The second time point t2 and the third time point t3 are time points in the second period p2 of the first switch cycle, and the third time point t3 is after the second time point t2.

Using the above-mentioned method of controlling the third switch S3 and the fourth switch S4, the sample and hold circuit 1241 may provide the first value V1 to the comparison circuit 1242 between the first time point t1 and the third time point t3, and provide the second value V2 to the comparison circuit 1242 between the second time point t2 and the third time point t3. This way, the comparison circuit 1242 may output the adjusting signal dOUT based on the first value V1 and the second value V2 between the second time point t2 and the third time point t3.

FIG. 6 is a diagram illustrating an implementation of the current adjusting circuit 1243 according to an embodiment of the present invention. As depicted in FIG. 6, the current adjusting circuit 1243 includes a trigger 12431 and an up/down counter 12432. The trigger 12431 is configured to output a trigger signal based on the adjusting signal dOUT and a clock signal dSUM. The pulse of the clock signal dSUM lasts from the fourth time point t4 to the third time point t3, wherein the second time point t2, the third time point t3 and the fourth time point t4 are time points in the second period p2 of the first switch cycle, the third time point t3 is after the second time point t2, and the fourth time point t4 is between the second time point t2 and the third time point t3. For example, the trigger 12431 may be a D-trigger depicted in FIG. 6. The D-trigger includes a D-pin for receiving the adjusting signal dOUT, a CK-pin for receiving the clock signal dSUM and a Q-pin and a Q'-pin for outputting the trigger signal. It is to be understood that the signal outputted via the Q-pin and the signal outputted via the Q'-pin have opposite logic levels.

The up/down counter 12432 is configured to adjust its output digit based on the trigger signal provided by the trigger 12431 so that the current source circuit 1220 may provide the constant current Isr whose magnitude matches the output digit. For example, the output digit of the up/down counter 12432 may be any integer between 0 and N, wherein Nis an integer larger than 1. Under such a circumstance, the magnitude of the constant current Isr outputted by the current source circuit 1220 may be equal to the current output digit of the up/down counter 12432 multiplied by a unit current magnitude.

In some embodiments, the up/down counter 12432 is configured to adjust its output digit based on the trigger signal and the clock signal dSUM. For example, clock signal dSUM may include a-DN pin and an UP-pin for receiving the trigger signal and a CK-pin for receiving the clock signal dSUM. Referring to FIG. 6, the DN-pin may be coupled to the Q-pin, and the UP-pin may be coupled to the Q'-pin. For example, when the first value V1 is smaller than the second value V2, the trigger signal outputted by the trigger 12431 includes a high-level signal outputted via the Q'-pin and a low-level signal outputted via the Q-pin. Under such a circumstance, the output digit of the up/down counter 12432 may be increased, thereby allowing the magnitude of the constant current Isr during the second switch cycle to be larger than the magnitude of the constant current Isr during the first switch cycle.

For another example, when the first value V1 is larger than the second value V2, the trigger signal outputted by the trigger 12431 includes a high-level signal outputted via the Q-pin and a low-level signal outputted via the Q'-pin. Under such a circumstance, the output digit of the up/down counter 12432 may be decreased, thereby allowing the magnitude of the constant current Isr during the second switch cycle to be smaller than the magnitude of the constant current Isr during the first switch cycle. This way, the current adjusting circuit 1243 may adjust the magnitude of the constant current Isr provided by the current source circuit 1220 during the second switch cycle based on the adjusting signal OUT.

In some embodiments, the interval between the second time point t2 and the fourth time point t4 is larger than or equal to the setup time of the trigger 12431. For example, the interval between the second time point t2 and the fourth time point t4 is essentially equal to the setup time of the trigger 12431. In some other embodiments, the interval between the third time point t3 and the fourth time point t4 is larger than or equal to the retaining time of the trigger 12431. For example, the interval between the third time point t3 and the fourth time point t4 is essentially equal to the retaining time of the trigger 12431. In some other embodiments, the interval between the second time point t2 and the fourth time point t4 is larger than or equal to the setup time of the trigger 12431, and the interval between the third time point t3 and the fourth time point t4 is larger than or equal to the retaining time of the trigger 12431.

Figure 7:
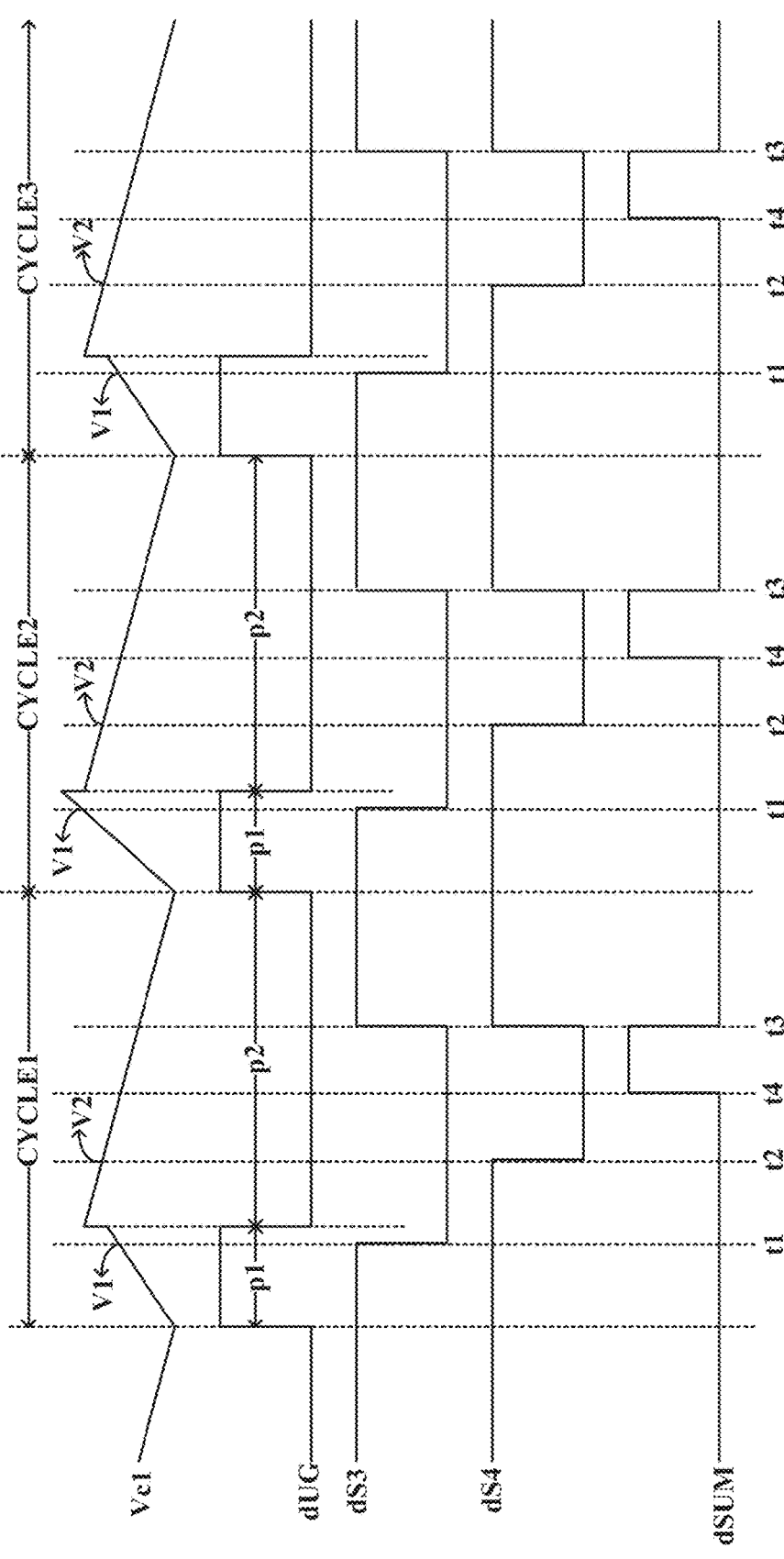
FIG. 7 is a diagram illustrating signal waveforms during the operation of the DC-DC converter according to other embodiments of the present invention.

For illustrative purpose, the following explanation incorporates FIG. 7. FIG. 7 is a diagram illustrating signal waveforms during the operation of the DC-DC converter according to other embodiments of the present invention. From top to bottom, FIG. 7 sequentially depicts the terminal voltage Vc1 of the first capacitor C1, the control signal dUG of the high-side transistor 11, the control signal dS3 of the third switch S3, the control signal dS4 of the fourth switch S4 and the clock signal dSUM. Contents of FIG. 7 similar to FIG. 2 are not reiterated herein.

As depicted in FIG. 7, the third switch S3 is configured to be switched from a turn-on state to a turn-off state at the first time point t1 and switched from the turn-off state to the turn-on state at the third time point t3. The fourth switch S4 is configured to be switched from a turn-on state to a turn-off state at the second time point t2 and switched from the turn-off state to the turn-on state at the third time point t3. The pulse of the clock signal dSUM lasts from the fourth time point t4 to the third time point t3. In these embodiments, the interval between the second time point t2 and the fourth time point t4 is larger than or equal to the setup time of the trigger 12431, and the interval between the fourth time point t4 and the third time point t3 is larger than or equal to the retaining time of the trigger 12431. In other words, the interval between the second time point t2 and the third time point t3 is larger than or equal to the sum of the setup time and the retaining time of the trigger 12431.

As previously stated, the comparison circuit 1242 is configured to output the adjusting signal dOUT based on the comparison result between the first value V1 and the second value V2 at least between the second time point t2 and the third t3. In other words, the adjusting signal dOUT remains constant at least between the second time point t2 and the third t3. That is, the adjusting signal dOUT remains constant at least during the setup time and the retaining time of the trigger 12431. Under such a circumstance, the trigger 12431 is guaranteed to output the trigger signal based on the adjusting signal dOUT provided by the comparison circuit 1242, thereby triggering the up/down counter 12432 to output accurate digits.

It is to be understood that in the above-mentioned embodiment, it is assumed that a switch/transistor is turned on by a high-level control signal and turned off by a low-level control signal. However, such assumptions are merely for illustrative purposes, but do not limit the scope of the present invention.

FIG. 8 is a flowchart illustrating a current detection method of a DC-DC converter according to an embodiment of the present invention. The DC/DC converter includes a high-side transistor 11 and a low-side transistor 12 coupled in series between the input end Vin and a ground. A switch node SW between the high-side transistor 11 and the low-side transistor 12 is coupled to an inductor. During each of a plurality of switch cycles of the DC-DC converter, the current detection method including steps 802-808 as depicted in FIG. 8 is performed.

In step 802, the current provided by the low-side transistor 12 to the inductor L is detected during the turn-on period of the low-side transistor 11, thereby generating the low-side detecting current Isen1.

In step 804, the terminal voltage Vc1 established on the first capacitor C1 is increased during the first period p1 using the constant current Isr, wherein the first period p1 is a turn-on period of the high-side transistor 11 or a turn-off period of the low-side transistor 12.

In step 806, the terminal voltage Vc1 established on the first capacitor C1 varies with the low-side detecting current Isen1 using the low-side detecting current Isen1 during the second period p2. The second period p2 and the first period p1 form a switch cycle of the DC-DC converter.

In step 808, the cycle detecting current Isen is outputted based on the terminal voltage Vc1 established on the second end of the first capacitor C1, wherein the first end of the first capacitor C1 is coupled to the ground.

It is to be understood that step 802 is executed during the execution of step 804, steps 804 and 806 are executed sequentially, and step 808 is executed during the entire switch cycle of the DC-DC converter. Each switch cycle includes two consecutive switch cycles: the first switch cycle and second switch cycle of the DC-DC converter.

During each switch cycle, the magnitude of the cycle detecting current Isen is determined based on the levels of the terminal voltage Vc1 established on the first capacitor C1 at least at two time points in the first switch cycle. The above-mentioned at least two time points include at least one time point in the second period p2 when the low-side transistor 12 is turned on. By performing the current detection method depicted in FIG. 8, the accuracy of inductor current detection may be improved.

In some embodiments, at least two time points include the first time point t1 in the first period p1 when the high-side transistor 11 is turned on, and at least one time point includes the second time point t2. Under such a circumstance, the magnitude of the constant current Isr during the second switch cycle may be adjusted based on the comparison result between the first value V1 of the terminal voltage Vc1 at the first time point t1 and the second value V2 of the terminal voltage Vc1 at the second time point t2. This way, the positive slope of the cycle detecting current Isen during the second switch cycle may be closer to the positive slope of the actual inductor current during the second switch cycle, thereby further improving the accuracy of inductor current detection.

In some embodiments, in the situation when the first value V1 is larger than the second value V2, the magnitude of the constant current Isr during the second switch cycle is adjusted to be smaller than the magnitude of the constant current Isr during the first switch cycle. In the situation when the first value V1 is smaller than the second value V2, the magnitude of the constant current Isr during the second switch cycle is adjusted to be larger than the magnitude of the constant current Isr during the first switch cycle.

The current detection method depicted in FIG. 8 may be performed using a DC-DC converter in any of the above-mentioned embodiments. Related details are not reiterated herein.

The present invention also provides a power conversion system which includes a current detection circuit of a DC-DC converter and the DC-DC converter in any of the above-mentioned embodiments.

The present invention also provides a power supply which includes a power conversion system in any of the above-mentioned embodiments. The above-mentioned power supply may be a power supply of a mobile phone, a computer or any electronic equipment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current detection circuit for a direct-current to direct-current (DC-DC) converter, the DC-DC converter comprising a high-side transistor and a low-side transistor coupled in series between an input end and a ground with a switch node formed between the high-side transistor and the low-side transistor, the switch node being coupled to an inductor, the current detection circuit comprising:

a first detection circuit configured to detect a current provided by the low-side transistor to the inductor during a turn-on period of the low-side transistor, thereby generating a low-side detecting current; and a processing circuit comprising a first capacitor having a first end coupled to the ground and configured to perform an operation during a first and a second switch cycle, wherein the operation includes:

outputting a cycle detecting current based on a terminal voltage established at a second end of the first capacitor;

increasing the terminal voltage established on the first capacitor by applying a constant current during a first period of the first switch cycle, wherein the first period is a turn-on period of the high-side transistor or a turn-off period of the low-side transistor;

varying the terminal voltage with the low-side detecting current generated during a second period of the first switch cycle, wherein:

during the first switch cycle, the turn-on period of the high-side transistor comprising a first time point, and a first value of the terminal voltage established on the first capacitor at the first time point; and during the first switch cycle, the turn-on period of the low-side transistor comprising a second time point, and a second value of the terminal voltage established on the first capacitor at the second time point;

adjusting the magnitude of the constant current during the second switch cycle to be smaller than the magnitude of the constant current during the first switch cycle when the first value is larger than the second value; and adjusting the magnitude of the constant current during the second switch cycle to be larger than the magnitude of the constant current during the first switch cycle when the first value is smaller than the second value.

2. The current detection circuit of claim 1, wherein an interval between the first time point and an end time of the first period in the first switch cycle is smaller than or equal to a first predetermined time length.

3. The current detection circuit of claim 2, wherein the first predetermined time length is equal to 10 ns.

4. The current detection circuit of claim 2, wherein the first predetermined time length is equal to one-tenth of the first period in the first switch cycle.

5. The current detection circuit of claim 2, wherein the first detection circuit includes an operational amplifier, the second time point is after an end time of a setting time of the operational amplifier during the first switch cycle, and a time length between the end time of the setting time and the second time point is smaller than or equal to a second predetermined time length.

6. The current detection circuit of claim 1, wherein the processing circuit comprises:

a current-to-voltage converting circuit configured to convert the low-side detecting current outputted by the first detection circuit into a voltage;

a first switch coupled between the second end of the first capacitor and the current-to-voltage converting circuit and configured to be turned off during a first period and turned on during a second period;

a current source circuit configured to provide the constant current;

a second switch coupled between the current source circuit and the second end of the first capacitor and configured to be turned on during the first period and turned off during the second period; and a voltage-to-current converting circuit coupled to the second end of the first capacitor and configured to convert the terminal voltage established on the first capacitor into the cycle detecting current.

7. The current detection circuit of claim 6, wherein the processing circuit further comprises an adjusting circuit coupled to the current source circuit and comprising:

a sample and hold circuit configured to sample the terminal voltages established on the first capacitor, thereby acquiring the first value and the second value;

a comparison circuit configured to compare the first value and the second value provided by the sample and hold circuit, thereby outputting an adjusting signal; and a current adjusting circuit configured to adjust the magnitude of the constant current provided by the current source circuit during the second switch cycle based on the adjusting signal.

8. The current detection circuit of claim 7, wherein the current adjusting circuit comprises:

a trigger configured to output a trigger signal based on the adjusting signal and a clock signal, wherein:

a pulse of the clock signal lasts from a fourth time point to a third time point;

the second time point, the third time point and the fourth time point are in the second period of the first switch cycle;

the third time point is after the second time point; and the fourth time point is between the second time point and the third time point; and an up/down counter configured to adjust an output number based on the trigger signal so as to match the magnitude of the constant current provided by the current source circuit with the output number.

9. The current detection circuit of claim 8, wherein an interval between the second time point and the fourth time point is larger than or equal to a setup time of the trigger.

10. The current detection circuit of claim 8, wherein an interval between the fourth time point and the third time point is larger than or equal to a retaining time of the trigger.

11. The current detection circuit of claim 7, wherein the sample and hold circuit comprises:

a voltage buffering circuit coupled to the second end of the first capacitor;

a third switch coupled between the voltage buffering circuit and a first input end of the comparison circuit;

a second capacitor including:

a first end coupled to a first node between the third switch and the first input end of the comparison circuit; and a second end coupled to the ground;

a fourth switch coupled between the voltage buffering circuit and a second input end of the comparison circuit; and a third capacitor including:

a first end coupled to a second node between the fourth switch and the second input end of the comparison circuit; and a second end coupled to the ground.

12. The current detection circuit of claim 11, wherein:

the third switch is configured to be switched from a turn-on state to a turn-off state at the first time point and switched from the turn-off state to the turn-on state at the third time point, enabling the second capacitor to retain a voltage of the first value between the first time point and the third time point;

the second time point and the third time point are in the second period of the first switch cycle, and the third time point is after the second time point; and the fourth switch is configured to be switched from the turn-on state to the turn-off state at the second time point and switched from the turn-off state to the turn-on state at the third time point, enabling the third capacitor to retain a voltage of the second value between the second time point and the third time point.

13. The current detection circuit of claim 1, wherein the processing circuit is configured to perform the operation during each switch cycle among multiple sets of switch cycles.

14. A current detection method for a direct-current to direct-current (DC-DC) converter, the DC-DC converter comprising a high-side transistor and a low-side transistor coupled in series between an input end and a ground, a switch node between the high-side transistor and the low-side transistor being coupled to an inductor, the current detection method, during each switch cycle among a plurality of switch cycles of the DC-DC converter, comprising:

outputting a cycle detecting current based on a terminal voltage established on a second end of a first capacitor, wherein a first end of the first capacitor is coupled to the ground;

detecting a current provided by the low-side transistor to the inductor during a turn-on period of the low-side transistor for acquiring a low-side detecting current;

increasing the terminal voltage established on the first capacitor using a constant current during a first period, wherein the first period is a turn-on period of the high-side transistor or a turn-off period of the low-side transistor;

varying the terminal voltage established on the first capacitor with the low-side detecting current using the low-side detecting current during a second period, wherein:

the first period and the second period forms a switch cycle which includes a first switch cycle and a second switch cycle of the DC-DC converter;

during the first switch cycle, the turn-on period of the high-side transistor comprising a first time point, and a first value of the terminal voltage established on the first capacitor at the first time point; and during the first switch cycle, the turn-on period of the low-side transistor comprising a second time point, and a second value of the terminal voltage established on the first capacitor at the second time point;

adjusting the magnitude of the constant current during the second switch cycle to be smaller than the magnitude of the constant current during the first switch cycle when the first value is larger than the second value; and adjusting the magnitude of the constant current during the second switch cycle to be larger than the magnitude of the constant current during the first switch cycle when the first value is smaller than the second value.

15. The current detection method of claim 14, wherein an interval between the first time point and an end time of the first period in the first switch cycle is smaller than or equal to a first predetermined time length.

16. The current detection method of claim 15, wherein:

the low-side detecting current is detected by a first detection circuit which includes an operational amplifier;

the second time point is after an end time of a setting time of the operational amplifier during the first switch cycle; and a time length between the end time of the setting time and the second time point is smaller than or equal to a second predetermined time length.

* * * * *